(12) United States Patent
Roub et al.

(10) Patent No.: US 9,673,076 B2
(45) Date of Patent: Jun. 6, 2017

(54) SYSTEM AND METHOD FOR ROTATIONAL TRANSFER OF ARTICLES BETWEEN VACUUM AND NON-VACUUM ENVIRONMENTS

(71) Applicant: Varian Semiconductor Equipment Associates, Inc., Gloucester, MA (US)

(72) Inventors: Sheri A. Roub, Woburn, MA (US); Stacia L. Theriault, Amesbury, MA (US); Fletcher I. Potter, Beverly, MA (US); Daniel L. Goodwin, Beverly, MA (US); Omar S. Kiyani, Cambridge, MA (US); Scott C. Holden, Melrose, MA (US)

(73) Assignee: VARIAN SEMICONDUCTOR EQUIPMENT ASSOCIATES, INC., Gloucester, MA (US)

( * ) Notice: Subject to any disclaimer, the term of this patent is extended or adjusted under 35 U.S.C. 154(b) by 641 days.

(21) Appl. No.: 14/072,419

(22) Filed: Nov. 5, 2013

(65) Prior Publication Data
US 2015/0125239 A1    May 7, 2015

(51) Int. Cl.
*H01L 21/677* (2006.01)
*H01L 21/67* (2006.01)

(52) U.S. Cl.
CPC .. *H01L 21/67748* (2013.01); *H01L 21/67201* (2013.01)

(58) Field of Classification Search
CPC ............ B65G 53/4633; B65G 53/4641; B65G 53/465

USPC .......................................................... 414/220
See application file for complete search history.

(56) References Cited

U.S. PATENT DOCUMENTS

| | | | | |
|---|---|---|---|---|
| 2,652,935 A | * | 9/1953 | Messing ................. | D21C 7/06 414/220 |
| 4,462,740 A | * | 7/1984 | Cytra ........................ | B01J 3/02 222/218 |
| 6,196,154 B1 | * | 3/2001 | Baumecker ............. | C23C 14/56 118/718 |
| 7,220,055 B2 | * | 5/2007 | Hertel ................. | F16C 32/0651 384/119 |
| 8,602,708 B2 | * | 12/2013 | Albrecht ................. | C23C 14/56 198/803.3 |
| 9,022,715 B2 | * | 5/2015 | Polyak .............. | H01L 21/67201 414/220 |

* cited by examiner

*Primary Examiner* — Jonathan Snelting (57) ABSTRACT

A device for transferring articles between an atmospheric pressure environment and a vacuum environment includes a transfer housing having an atmospheric transfer port, a pumping port, a vacuum transfer port, and a venting port disposed in a circumferentially-spaced relationship. The vacuum transfer port is in communication with the vacuum environment and the atmospheric transfer port is in communication with the atmospheric pressure environment. The device can include a carrier disc rotatably disposed within the transfer housing, the carrier disc having a pocket formed in a sidewall thereof for holding an article. The device may further include an air bearing associated with the transfer housing and configured to expel gas to maintain a gap between the transfer housing and the carrier disc.

7 Claims, 11 Drawing Sheets

SYSTEM AND METHOD FOR ROTATIONAL TRANSFER OF ARTICLES BETWEEN VACUUM AND NON-VACUUM ENVIRONMENTS

FIELD OF THE DISCLOSURE

The disclosure relates generally to the field of semiconductor device fabrication, and more particularly to a device and method for moving semiconductor workpieces into and out of a vacuum environment.

BACKGROUND OF THE DISCLOSURE

Ion implantation is a technique for introducing conductivity-altering impurities into semiconductor workpieces. During ion implantation, a desired impurity material is ionized in an ion source chamber, the ions are accelerated to form an ion beam of prescribed energy, and the ion beam is focused and directed toward the surface of a workpiece positioned in a process chamber. The energetic ions in the ion beam penetrate into the bulk of the workpiece material and are embedded into the crystalline lattice of the material to form a region of desired conductivity.

Semiconductor workpieces are highly susceptible to particulate contamination that can detrimentally alter the conductivity characteristics of a workpiece. In order to mitigate such contamination, ion implantation is typically performed in high vacuum environments. It is therefore necessary to employ transfer devices for moving workpieces into and out of such vacuum environments in an expeditious manner while simultaneously minimizing the creation and transmission of particulate matter.

Traditional batch-transfer load-lock systems for moving semiconductor workpieces into and out of vacuum environments typically include one or more load-locks that are each configured to receive one or more workpieces at a time. In some embodiments, a cassette of vertically-stacked semiconductor workpieces is transferred into a load lock from a side of the load-lock that is exposed to an atmospheric pressure environment. After the stack of workpieces has been loaded into a load-lock from the atmospheric side, the load-lock is sealed and an interior of the load-lock is pumped down to vacuum pressure. A side of the load-lock that is exposed to a high vacuum pressure processing environment is then opened and one or more of the workpieces in the stack are collected for subsequent transfer to an ion implanter. After the workpieces have been implanted, the above-described transfer process is performed in reverse to move the workpieces back to the atmospheric pressure environment where they may be collected for further processing.

A problem that is associated with traditional batch-transfer load-lock systems of the type described above is that semiconductor workpieces may be exposed to different amounts of particulate depending on their respective positions within a stack. For example, a workpiece that is at a top position in a stack may gather a greater amount of particulate than workpieces at lower positions within the stack that are shielded by workpieces at higher positions. This may result in uneven particulate contamination amongst workpieces, and therefore inconsistent conductivity characteristics, within a batch of semiconductor workpieces handled by a particular load-lock.

SUMMARY

In view of the foregoing, it would be advantageous to provide a device and method for transferring articles into and out of a vacuum environment in a sequential manner under substantially identical conditions, such conditions including article position and exposure to contaminants. Moreover, it would be advantageous to provide such a system and method that improve that the throughput of articles that are transferred into and out of a vacuum environment.

An exemplary device for transferring articles between an atmospheric pressure environment and a vacuum environment in accordance with the present disclosure may include a transfer housing having an atmospheric transfer port, a pumping port, a vacuum transfer port, and a venting port disposed in a circumferentially-spaced relationship, wherein the vacuum transfer port is in communication with the vacuum environment and the atmospheric transfer port is in communication with the atmospheric pressure environment. The device may further include a carrier disc rotatably disposed within the transfer housing, the carrier disc having a pocket formed in a sidewall thereof for holding an article.

An exemplary method for transferring an article between an atmospheric pressure environment and a vacuum environment in accordance with the present disclosure may include moving the article into a pocket within a carrier disc, rotating the carrier disc relative to a transfer housing to a position wherein the pocket is aligned with a vacuum transfer port in the transfer housing, wherein the vacuum transfer port is in communication with the vacuum environment, and moving the article out of the pocket and into the vacuum environment. The exemplary method may further include maintaining a gap between the transfer housing and the carrier disc during the rotating step.

DETAILED DESCRIPTION

A device and method in accordance with the present disclosure will now be described more fully hereinafter with reference to the accompanying drawings, in which preferred embodiments of the device and method are shown. The device and method, however, may be embodied in many different forms and should not be construed as being limited to the embodiments set forth herein. Rather, these embodiments are provided so that this disclosure will be thorough and complete, and will fully convey the scope of the device and method to those skilled in the art. In the drawings, like numbers refer to like elements throughout.

Figure 1:
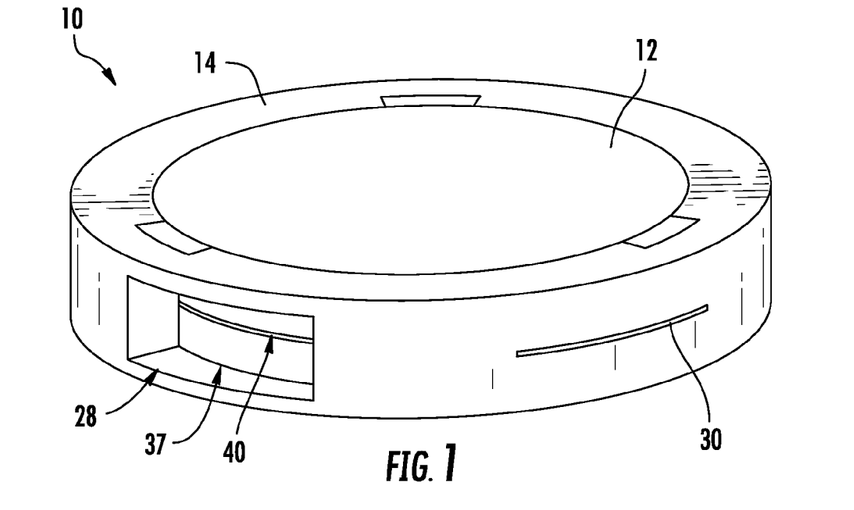
FIG. 1 is a top perspective view illustrating an exemplary vacuum transfer device in accordance with the present disclosure.

Referring to FIG. 1, an exemplary device 10 is shown for transferring articles into and out of a vacuum environment in accordance with the present disclosure. The device 10 may be described herein for use in transferring semiconductor workpieces between an atmospheric side and a vacuum side of an ion implant system. It will be appreciated, however, by those of ordinary skill in the art that the device 10 may be similarly implemented in virtually any type of process or system in which articles are transferred between vacuum and non-vacuum environments. Such processes and systems include, but are not limited to, milling, deposition, etching, ashing, cleaning, lithography, inspection and the like. Other applications are contemplated and may be implemented without departing from the scope of the present disclosure.

In general, the device 10 may be coupled between atmospheric and vacuum environments of a workpiece processing system to transfer workpieces therebetween. In use a workpiece can be loaded into the device 10 through an atmospheric transfer port 28 of the transfer housing 14, where it is received by the carrier disc 12. The carrier disc 12 may be controllably rotatable with respect to the transfer housing 14, and the carrier disc 12 and workpiece can be rotated until the workpiece is aligned with a vacuum transfer port 34 of the transfer housing. The workpiece can then be unloaded through the vacuum transfer port 34 into the vacuum environment. A similar, reversed, operation can also be performed to transfer a processed workpiece from the vacuum environment to the atmospheric environment.

Figure 2:
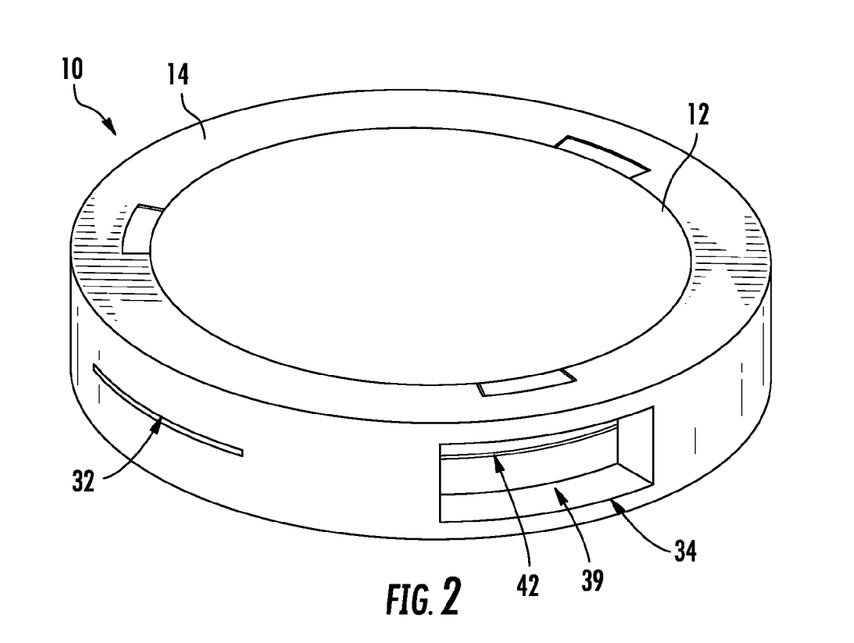
FIG. 2 is a second top perspective view illustrating the exemplary vacuum transfer device shown in FIG. 1.
Figure 3:
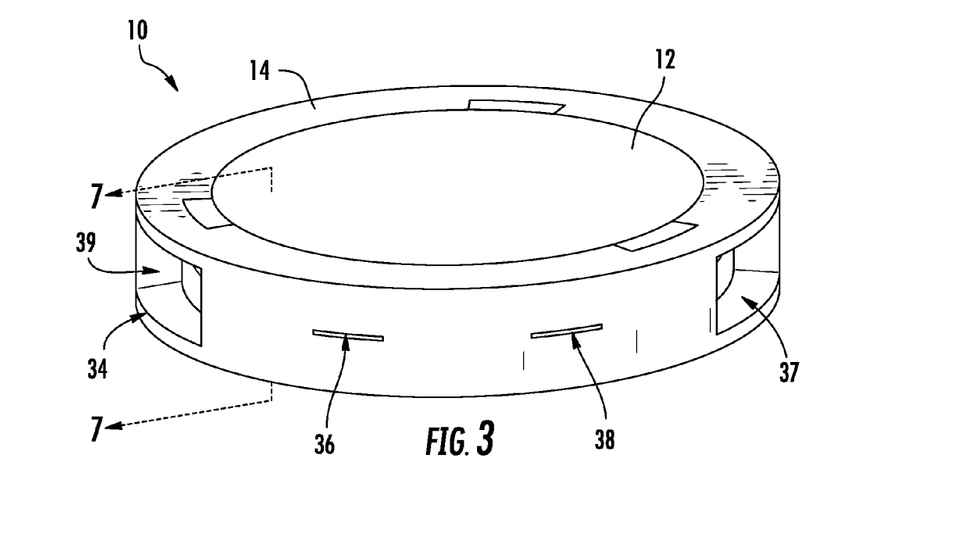
FIG. 3 is a third top perspective view illustrating the exemplary vacuum transfer device shown in FIG. 1.

FIGS. 1-3 show the carrier disc 12 and transfer housing 14 in the assembled condition, illustrating the orientation and placement of the atmospheric transfer port 28 and the vacuum transfer port 34. Other illustrated aspects of the device will be described in greater detail later.

Figure 4:
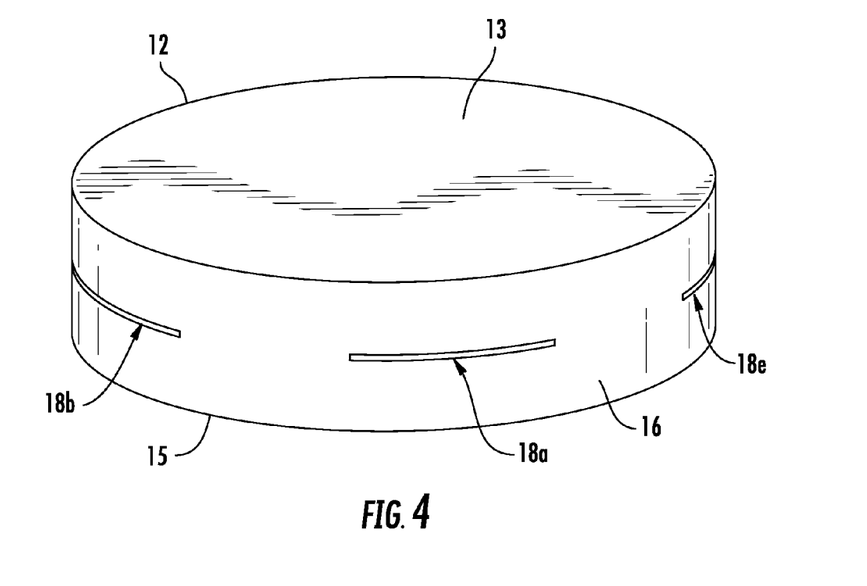
FIG. 4 is a top perspective view illustrating a carrier disc of the exemplary vacuum transfer device shown in FIG. 1.

Referring to FIG. 4, the carrier disc 12 is shown separate from the transfer housing 14. As can be seen, the carrier disc 12 can be a substantially cylindrical body having a top surface 13, a bottom surface 15, and a sidewall 16. In one example, the carrier disc 12 may be formed from a single piece of aluminum and may have a diameter of about 55" and a height of about 13". These dimensions and materials are not critical, however, and it will be appreciated that the carrier disc 12 may be formed of various other metals, plastics, and/or composites, and may be made smaller or larger for accommodating workpieces of various shapes and sizes as will become apparent below.

As shown in FIG. 4 (and in more detail in FIG. 8), the sidewall 16 of the carrier disc 12 may include a plurality of circumferentially-spaced cavities or pockets formed therein, including a first pocket 18a, a second pocket 18b, a third pocket 18c, a fourth pocket 18d, and a fifth pocket 18e. Each pocket 18a-e may have a size and shape suitable for receiving a workpiece as further described below. For example, each of the pockets 18a-e may be a substantially semi-circular, horizontally-oriented slot measuring about 18 inches wide by about 0.40 inches tall for accommodating thin, circular workpieces. These dimensions may of course be varied for accommodating workpieces of different shapes and sizes. Further, although the carrier disc 12 is shown as having five pockets 18a-e spaced evenly about the circumference of the carrier disc 12 and disposed equidistant between the top and bottom of the sidewall 16, it will be appreciated that the number, locations and spacings of the pockets 18a-e may be varied without departing from the present disclosure.

Figure 5:
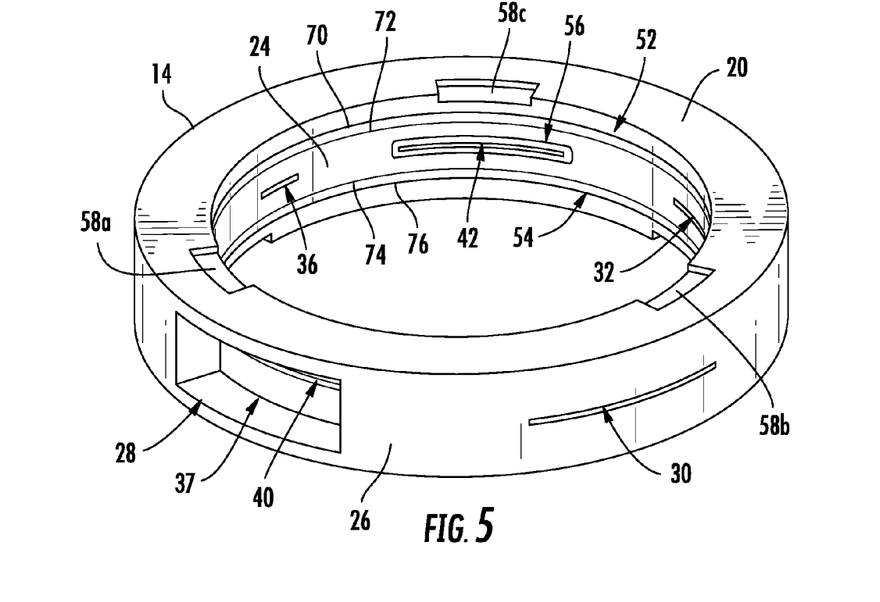
FIG. 5 is a top perspective view illustrating a transfer housing of the exemplary vacuum transfer device shown in FIG. 1.
Figure 6:
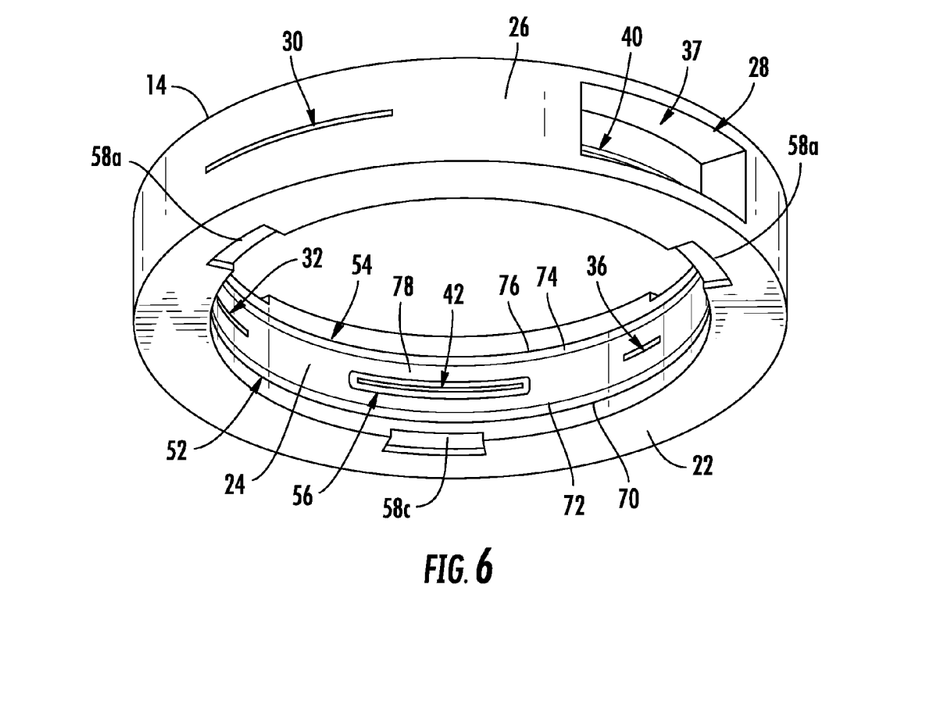
FIG. 6 is a bottom perspective view illustrating the transfer housing of the exemplary vacuum transfer device shown in FIG. 1.

Referring now to FIGS. 5 and 6, the transfer housing 14 is shown separate from the carrier disc 12. The transfer housing 14 can be a ring-shaped body having a top surface 20, a bottom surface 22, an inner sidewall 24, and an outer sidewall 26. In one non-limiting example, the transfer housing 14 may be formed of aluminum and may have an inner diameter that is slightly larger (e.g., 60 microns larger) than then outer diameter of the carrier disc 12, and a height that is substantially equal to the height of the carrier disc 12. It is contemplated, however, that the transfer housing 14 may be formed of various other metals, plastics, and/or composites, and may be dimensioned as desired.

As previously noted, the transfer housing 14 may include an atmospheric transfer port 28 for transferring a workpiece into the device 10. The transfer housing 14 may also include a first pumping port 30, a second pumping port 32, and a vacuum transfer port 34 (see FIGS. 1 & 2). First and second venting ports 36, 38 (see FIG. 3) may also be provided. The first and second pumping ports 30, 32, the vacuum transfer port 34, and the first and second venting ports 36, 38 may be spaced about the circumference of the transfer housing 14 and may provide respective passageways that extend through the transfer housing 14 between the inner and outer sidewalls 24 and 26 thereof. It will be appreciated that although the illustrated embodiment includes a pair of pumping ports (first and second pumping ports 30, 32) and a pair of venting ports (first and second venting ports 36, 38), that this is not critical, and multiple additional pumping ports and venting ports can be used, as desired.

Thus, it will be understood that there can be multiple stages of pumping and/or multiple stages of venting, since the timely execution of a pumpdown cycle and also a venting cycle requires controlled rates and pressure ranges to optimize timing while also avoiding detrimental particle generation (e.g., condensation, agitation of particles by shock, etc.). Thus, the number of pumping and/or venting stages need not be limited.

Referring again to FIGS. 1 and 2, the atmospheric transfer port 28 and the vacuum transfer port 34 are shown as having a stepped configuration. That is, relatively large opening portions 37, 39 are formed in the outer sidewall 26 of the transfer housing 14, and are connected to a relatively small, slit-like, opening portions 40, 42 in formed in the inner sidewall 24 of the transfer housing 14. The large opening portions 37, 39 may accommodate external workpiece-handling equipment (e.g., end effectors of robotic arms) when workpieces are inserted into, and removed from, the carrier disc 12 as further described below. The small, slit-like, opening portions 40, 42 may correspond to the pockets 18a-e in the carrier disc 12. The precise size and shape of the large opening portions 37, 39 and the small, slit-like, opening portions 40, 42 may be varied to accommodate the requirements of the particular process(es) being performed and the particular handling equipment being used.

Figure 8:
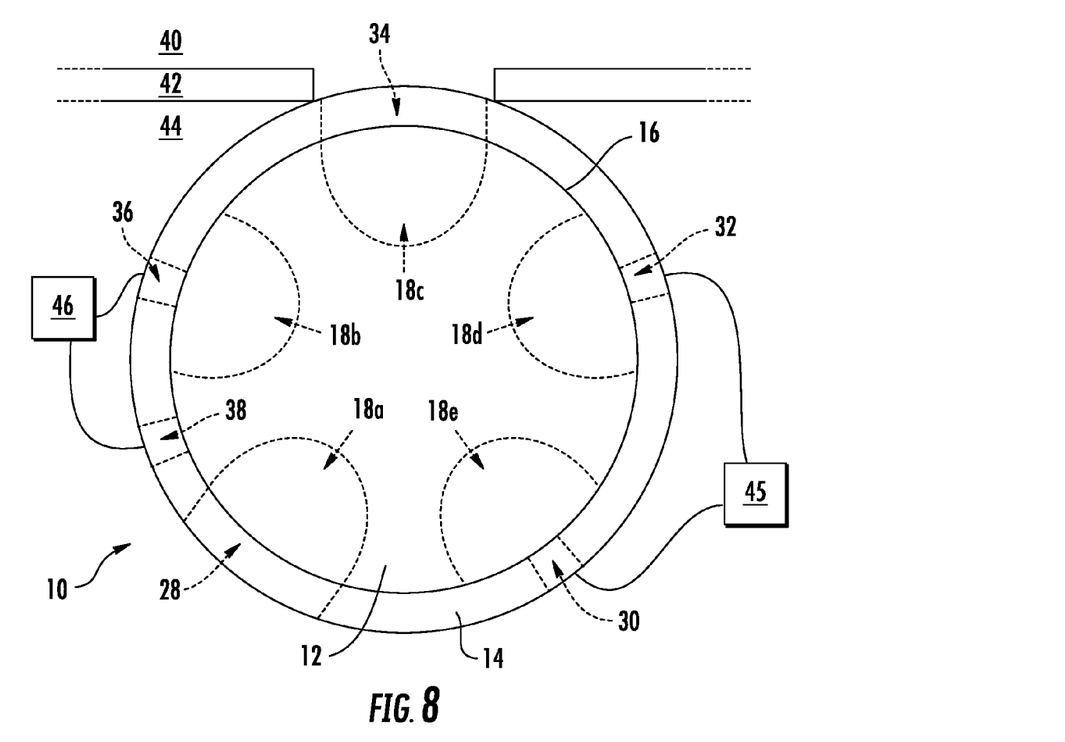
FIG. 8 is schematic plan view illustrating an operative configuration of the exemplary vacuum transfer device shown in FIG. 1.

As can be seen in FIG. 8, the vacuum transfer port 34 of the transfer housing 14 may be open to a high vacuum environment 40 that is maintained within a vacuum enclosure 42. In one non-limiting exemplary embodiment, the high vacuum environment 40 may be a high vacuum portion of an ion implantation system. The atmospheric transfer port 28 of the transfer housing 14 may be open to an atmospheric environment 44 located outside of the vacuum enclosure 42.

The first and second pumping ports 30, 32 of the transfer housing 14 may be coupled to one or more vacuum pumps 45 so that the pockets 18a-e of the carrier disc 12 can be pumped down during operation of the device 10, as will be further described below. Similarly, the first and second venting ports 36 and 38 of the transfer housing 14 may be coupled to one or more gas sources 46 for venting the pockets 18a-e of the carrier disc 12 during operation of the device 10 as further described below.

Referring now to FIGS. 5 and 6, the transfer housing 14 may include upper and lower differential pumping regions 52 and 54 disposed within the inner sidewall 24 above and below the first and second pumping ports 30, 32, the vacuum transfer port 34, and the first and second venting ports 36, 38, respectively. In the illustrated embodiment, these upper and lower differential pumping regions 52, 54 comprise circumferential grooves. The transfer housing 14 may further include an intermediate differential pumping region 56 disposed within the inner sidewall 24 and surrounding the vacuum transfer port 34. As will be appreciated, the upper, lower and intermediate pumping regions 52, 54, 56 may be operated to remove gas from a gap "g" (see FIG. 7) between the carrier disc 12 and the transfer housing 14. In some embodiments, some or all of this gas may exist due to the presence of one or more air bearings, which will now be described. It will be appreciated that although the support mechanism for the carrier disc 12 in the illustrated embodiment is described as comprising one or more air bearings, the use of air bearings is not critical and other appropriate support and bearing arrangements can be used, as desired.

As previously noted, the carrier disc 12 may be rotatable with respect to the transfer housing 14. In some embodiments one or more air bearings 58a-c may be used to minimize or eliminate contact between the carrier disc 12 and transfer housing 14 during rotation and otherwise. In the illustrated embodiment, a plurality of circumferentially-spaced, upper air bearings 58a-c may be recessed in the transfer housing 14 adjacent to the carrier disc 12. As shown, the upper air bearings 58a-c may be flush with the inner sidewall 24 adjacent to the top surface 20 of the transfer housing 14. Similarly, a plurality of circumferentially-spaced lower air bearings 60a-c may be flush with the inner sidewall 24 adjacent to the bottom surface 22 of the transfer housing 14. The specific structure and function of the upper, lower and intermediate differential pumping regions 52-56 and the air bearings 58a-c and 60a-c will be described in greater detail below.

When the device 10 is operatively assembled as shown in FIGS. 1-3 and 8, the carrier disc 12 may be seated within the transfer housing 14 so that the two pieces are in a substantially coaxial relationship. In one embodiment, the top surface 13 and bottom surface 15 of the carrier disc 12 may be substantially flush with the top surface 20 and bottom surface 22 of the transfer housing 14, but this is not critical. In practical application, the sidewall 16 of the carrier disc 12 may be disposed in a continuous, close-clearance relationship with the inner sidewall 24 of the transfer housing 14. For example, referring to FIG. 7, gap "g" may separate the sidewall 16 of the carrier disc 12 from the inner sidewall 24 of the transfer housing 14. In one non-limiting exemplary embodiment the gap "g" may be about 30 microns. A non-limiting exemplary range for the width of the gap "g" may be about 1 micron to about 1 millimeter. Of course, the gap "g" may be made narrower or wider as desired without departing from the present disclosure.

Figure 7:
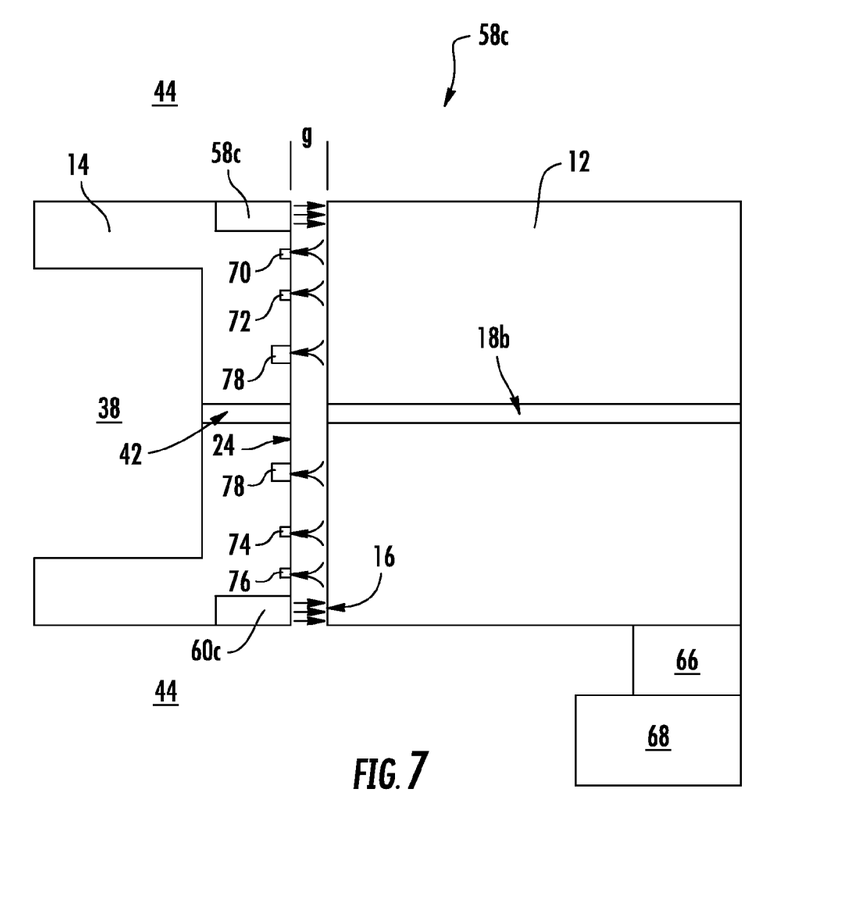
FIG. 7 is a partial cross-section view the exemplary vacuum transfer device shown in FIG. 3, taken along line 7-7 of FIG. 3.

As shown in FIG. 7, the carrier disc 12 may be coupled to a drive shaft 66 which may in-turn be coupled to a drive mechanism 68. The drive mechanism 68 may be any device that is capable of rotating the drive shaft 66 and attached carrier disc 12 about a vertical axis of the carrier disc 12 in a controlled manner. In one non-limiting embodiment, the drive mechanism 68 may be an electric motor such as a servo motor. During operation of the system 10, the drive mechanism 68 and drive shaft 66 may rotate the carrier disc 12 relative to the transfer housing 14 in a predetermined, incremental manner as will be described in greater detail below.

As previously noted, the carrier disc 12 is rotatable with respect to the transfer housing 14 to enable selective movement of a workpiece between the atmospheric transfer port 28 and the vacuum transfer port 34. As will be appreciated, the air bearings 58a-c and 60a-c may function to center the carrier disc 12 within the transfer housing 14 during this rotation, thereby preventing contact between the two structures. In operation, the air bearings 58a-c and 60a-c may expel pressurized air radially inwardly toward the carrier disc 12, such as via radially inwardly-facing gas outlets (not shown). The pressurized air may be supplied to the outlets by one or more high pressure air sources (not shown) coupled thereto, for example. The air bearings 58a-c and 60a-c may thereby create a film of air that fills and maintains the gap "g." Thus, under normal operating conditions, no solid-to-solid contact between the carrier disc 12 and the transfer housing 14 occurs, thereby minimizing the generation of particulate contaminants that could otherwise be produced as a result of engagement between the carrier disc 12 and the transfer housing 14. It will be appreciated that the use of air with the air bearings 58a-c and 60a-c is not critical, and that other gases can be similarly employed for filling and maintaining the air gap "g." In some embodiments, the air pressure produced by the air bearings 58a-c and 60a-c may be in the range of about 70 pounds per square inch (psi) to about 90 psi. Other values may of course be used, as desired for a particular application.

In some embodiments, the air bearings 58a-c and 60a-c may be formed of a material having a relatively low coefficient of friction, such as graphite. In a particular embodiment, each of the air bearings 58a-c and 60a-c may be formed of a piece of graphite with discrete openings formed therein for defining outlets. In another contemplated embodiment, the air bearings 58a-c and 60a-c may be formed of porous graphite, and pressurized air may be expelled from the air bearings 58a-c and 60a-c through naturally-occurring the pores in the material.

As described above, the interior of the vacuum enclosure 42 may be held under high vacuum conditions (e.g., $1\times10^{-5}$ to $1\times10^{-7}$ Torr), while conditions outside of the vacuum enclosure 42 may be at normal atmospheric pressure. Thus, the space within and surrounding the vacuum transfer port 34 of the carrier housing 14 may be subject to high vacuum conditions while the space above and below the device 10 may be subject to normal atmospheric conditions. Due to the existence of such a high differential pressure within and surrounding the device 10, gases from the atmospheric pressure environment 44, and from the air bearings 58a-c and 60a-c, may tend to migrate toward the vacuum transfer port 34. If such gases were allowed to enter the vacuum enclosure 42, they could cause contamination and adversely affect conditions within the vacuum enclosure 42. An appropriate sealing arrangement may, therefore, be employed to prevent gas from the atmospheric pressure environment 44 and the air bearings 58 and 68 from entering the vacuum enclosure 42.

As previously described, upper, lower and intermediate differential pumping regions 52, 54, 56 may be provided to seal against the ingress of air or other gases into the vacuum enclosure 42. In the illustrated embodiment, these differential pumping regions 52-56 may be provided in respective portions of the transfer housing 14, as best seen in FIGS. 5, 6 and 8. For example, each of the differential pumping regions 52-56 may include one or more grooves 70, 72, 74, 76, and 78 formed in the inner sidewall 24 of the transfer housing 14. In the illustrated embodiment, the upper and lower differential pumping regions 52 and 54 each include two circumferential grooves 70-76 arranged to form individual, annular channels in the inner sidewall 24, and the intermediate differential pumping region 56 may include a single groove 78 that forms a continuous channel surrounding the vacuum transfer port 34. It is contemplated that instead of being continuous channels, one or more of the grooves 70-78 may include a plurality of discrete ports.

The grooves 70-78 may be coupled to one or more vacuum sources (not shown), such as via conduits disposed within the transfer housing 14, for example. The vacuum sources may draw gas into the grooves 70-78 in a successive, multi-tiered manner as best shown in FIG. 7. Particularly, gas that migrates toward the vacuum transfer port 34 from the atmospheric pressure environment 44 and the air bearings 58a-c and 60a-c may first encounter the uppermost groove 70 of the upper differential pumping region 52 and the lowermost groove 76 of the lower differential pumping region 54, which may capture a portion of the gas. Any remaining gas that is able to migrate past the groves 70 and 76, toward the vacuum transfer port 34, may then encounter the lowermost groove 72 of the upper differential pumping region 52 and the uppermost groove 74 of the lower differential pumping region 54, which may capture a portion of the remaining gas. Any remaining gas that is able to migrate past the grooves 72 and 72, toward the vacuum transfer port 34, may finally encounter the groove 78 of the intermediate differential pumping region 56, which may capture the remaining gas. Thus, any gas that may migrate toward the vacuum transfer port 34 of the transfer shaft transfer housing 14 may be drawn into the grooves 70-78 before it is able to enter the vacuum transfer port 34. The flow of air into the high vacuum environment 40 is thereby mitigated or entirely prevented.

It will be appreciated that while the illustrated embodiment of the system 10 employs the upper, lower and intermediate differential pumping regions 52-56 to seal the high vacuum environment 40 from the atmospheric pressure environment 44 and the air bearings 58a-c and 60a-c, other sealing devices and arrangements could be additionally or alternatively implemented. For example, it is contemplate that a lip seal arrangement could be used in lieu of, or in addition to, the pumped grooves 70-78. It is further contemplated that the number and positions of the differential pumping regions 52-56 and the grooves 70-78 may be varied without departing from the present disclosure.

Figure 9:
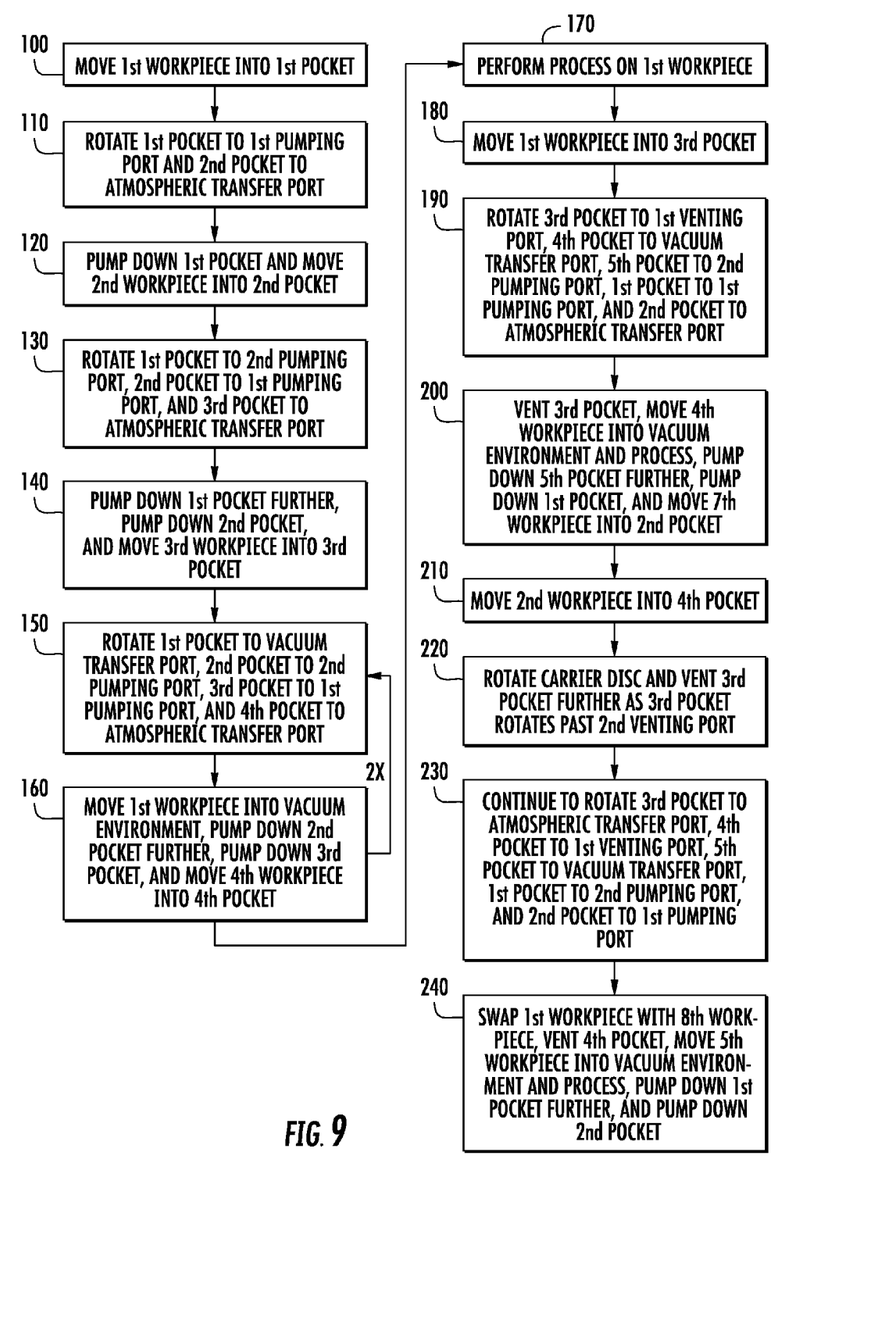
FIG. 9 is flow diagram illustrating a method of operating the exemplary vacuum transfer device shown in FIG. 1.

Referring to FIG. 9, a flow diagram illustrating an exemplary method for operating the device 10 in accordance with the present disclosure is shown. The method will now be described in conjunction with the schematic representations of the system 10 shown in FIGS. 10-18.

Figure 10:
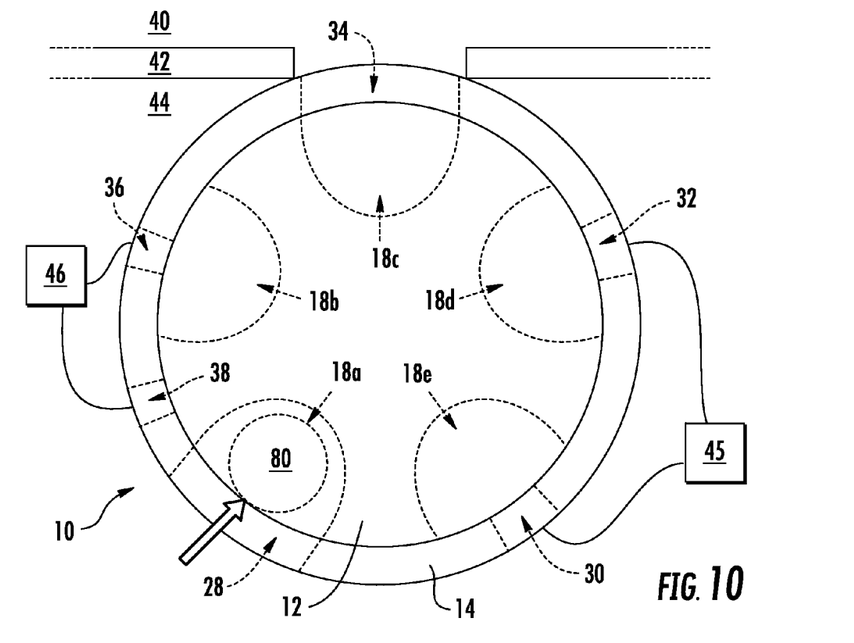
FIGS. 10-18 are a series of schematic plan views illustrating the exemplary method set forth in FIG. 9 being performed using the exemplary vacuum transfer device shown in FIG. 1.

At step 100, with the carrier disc 12 oriented such that the first pocket 18a is aligned with the atmospheric transfer port 28 as shown in FIG. 10, a first workpiece 80 may be moved from the atmospheric pressure environment 44 into the first pocket 18a via the atmospheric transfer port 28. The workpiece 80 may be moved by a robotic arm (not shown) located in the atmospheric pressure environment 44, for example.

Figure 11:
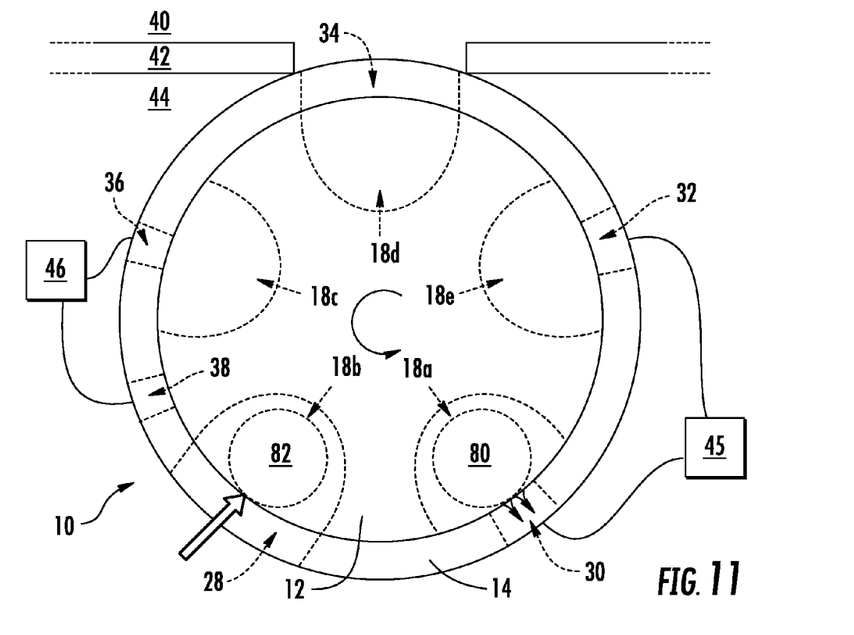

At step 110, the drive mechanism 68 (see FIG. 7) may rotate the carrier disc 12 counterclockwise until the first pocket 18a is brought into alignment with the first pumping port 30 and the second pocket 18b is brought into alignment with the atmospheric transfer port 28 as shown in FIG. 11. At step 120, the vacuum source 44 coupled to the first pumping port 30 may be activated, drawing air out of the first pocket 18a through the first pumping port 30 as shown in FIG. 11. The interior of the first pocket 18a may be pumped down to a first pressure (e.g., 3 Torr) that is lower than atmospheric pressure but higher than that of the high vacuum environment 40 within the vacuum enclosure 42. As the first pocket 18a is being pumped down, a second workpiece 82 may be moved into the second pocket 18b in the manner described in step 100.

Figure 12:
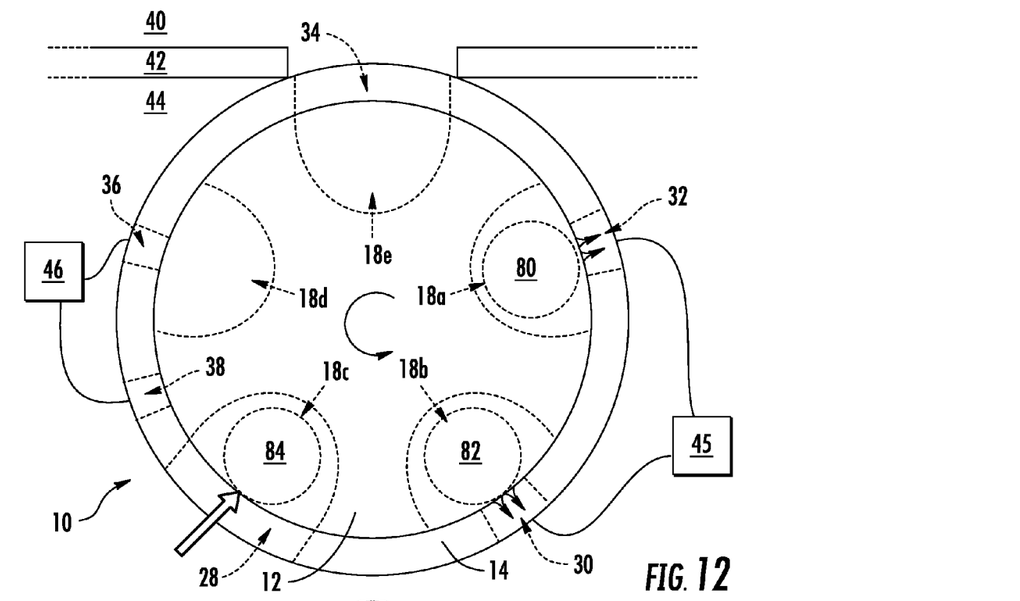

At step 130, the drive mechanism 68 may rotate the carrier disc 12 counterclockwise until the first pocket 18a is brought into alignment with the second pumping port 32, as shown in FIG. 12. At the same time, the second pocket 18b may be brought into alignment with the first pumping port 30, and the third pocket 18c is brought into alignment with the atmospheric transfer port 28 as shown in FIG. 12.

At step 140, the vacuum source 44 coupled to the second pumping port 32 may be activated, thereby drawing substantially all remaining air out of the first pocket 18a through the second pumping port 32 as shown in FIG. 12. The interior of the first pocket 18a, having been previously partially pumped down by the first pumping port 30, may thus be pumped down to a vacuum pressure (e.g., $1 \times 10^{-3}$ Torr) that is compatible with the high vacuum environment 40 within the vacuum enclosure 42. Alternatively, the transfer housing 14 may be provided with only a single pumping port that may pump the first pocket 18a down from atmospheric pressure to vacuum pressure in a single step. While the first pocket 18a is being pumped down via the second pumping port 32, the second pocket 18b may be pumped down via the first pumping port 30 in the manner described in step 120, and a third workpiece 84 may be moved into the third pocket 18c in the manner described in step 100.

Figure 13:
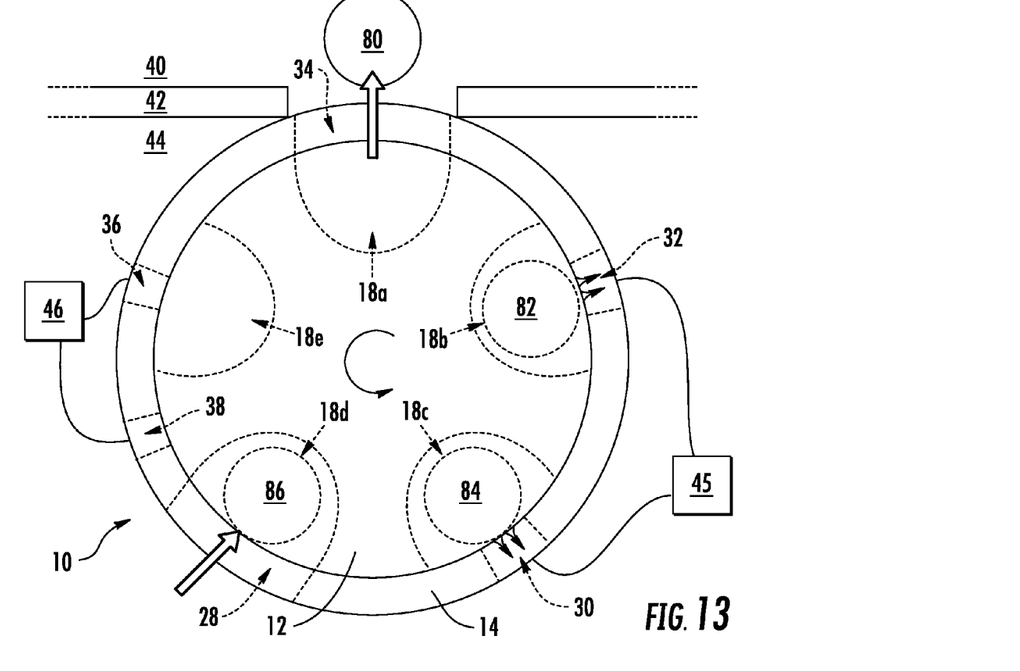

At step 150, the drive mechanism 68 may rotate the carrier disc 12 counterclockwise until the first pocket 18a is brought into alignment with the vacuum transfer port 34, the second pocket 18e is brought into alignment with the second pumping port 32, the third pocket 18c is brought into alignment with the first pumping port 30, and the fourth pocket 18d is brought into alignment with the atmospheric transfer port 28 as shown in FIG. 13.

At step 160, the first workpiece 80 may be moved from the first pocket 18a into the high vacuum environment 40 via the vacuum transfer port 34 as shown in FIG. 13. The first workpiece 80 may be moved by a robotic arm (not shown) located in the high vacuum environment 40, for example. The first workpiece 80 may thereafter, at step 170, be subjected to one or more processes (e.g., ion implantation) within the high vacuum environment 40. While the first workpiece 80 is being moved and/or processed thusly, the second pocket 18b may be pumped down via the second pumping port 32 in the manner described in step 140, the third pocket 18c may be pumped down via the first pumping port 30 in the manner described in step 120, and a fourth workpiece 86 may be moved into the fourth pocket 18d in the manner described in step 100. The fifth pocket 18e may be vented via the first venting port 36.

The above described steps 150 and 160 may be repeated twice, with carrier disc 12 being incrementally rotated, the second and third workpieces 82 and 84 being moved into the high vacuum environment 40, and fifth and sixth workpieces 88 and 90 being moved into the fifth and first pockets 18e and 18a, respectively.

Figure 14:
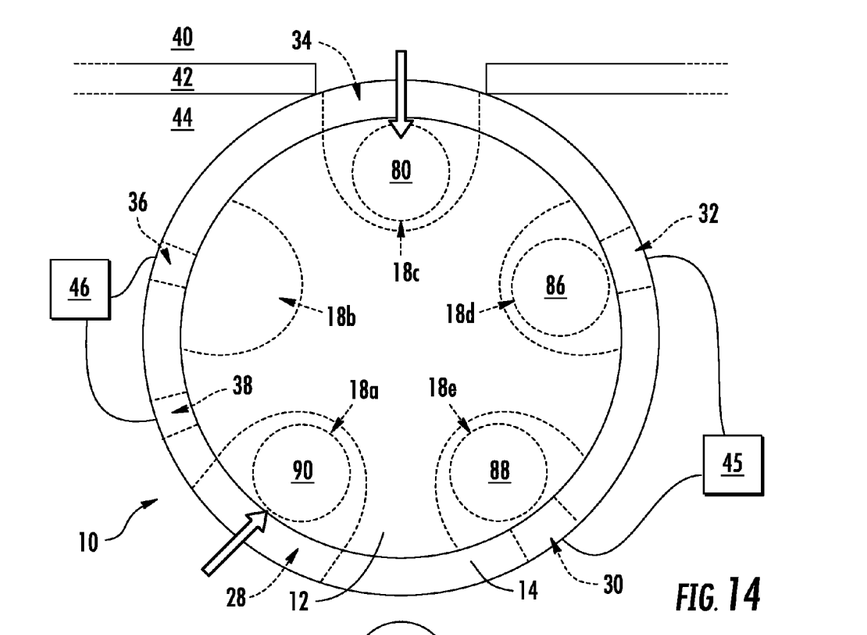

After being processed, the workpiece 80 may, at step 180, be moved into the third pocket 18c via the vacuum transfer port 34 as shown in FIG. 14. Alternatively, it is contemplated that a different workpiece which may have been processed in the high vacuum environment 40 may be moved into the third pocket 18c.

Figure 15:
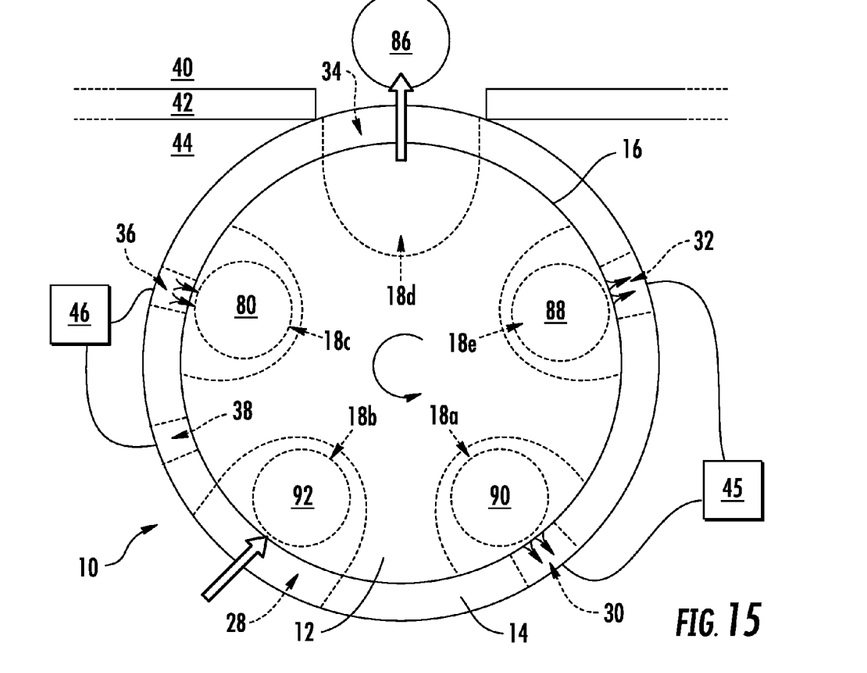

At step 190, the drive mechanism 68 may rotate the carrier disc 12 counterclockwise until the third pocket 18c is brought into alignment with the first venting port 36, the fourth pocket 18d is brought into alignment with the vacuum transfer port 34, the fifth pocket 18e is brought into alignment with the second pumping port 32, the first pocket 18a is brought into alignment with the first pumping port 30, and the second pocket 18b is brought into alignment with the atmospheric transfer port 28 as shown in FIG. 15.

At step 200, the pressurized air source 46 coupled to the first venting port 36 may be activated, pumping an amount of air through the first venting port 36 into the third pocket 18c as shown in FIG. 15. The interior of the third pocket 18c may thus be vented to a pressure (e.g., 10 Torr) that is higher than that of the high vacuum environment 40 but lower than atmospheric pressure. While the third pocket 18c is being vented, the fourth workpiece 86 may be moved and processed in the manner described in steps 160 and 170, the fifth pocket 18e may be pumped down via the second pumping port 32 in the manner described in step 140, the first pocket 18a may be pumped down via the first pumping port 30 in the manner described in step 120, and a seventh workpiece 92 may be moved into the second pocket 18b in the manner described in step 100.

Figure 16:
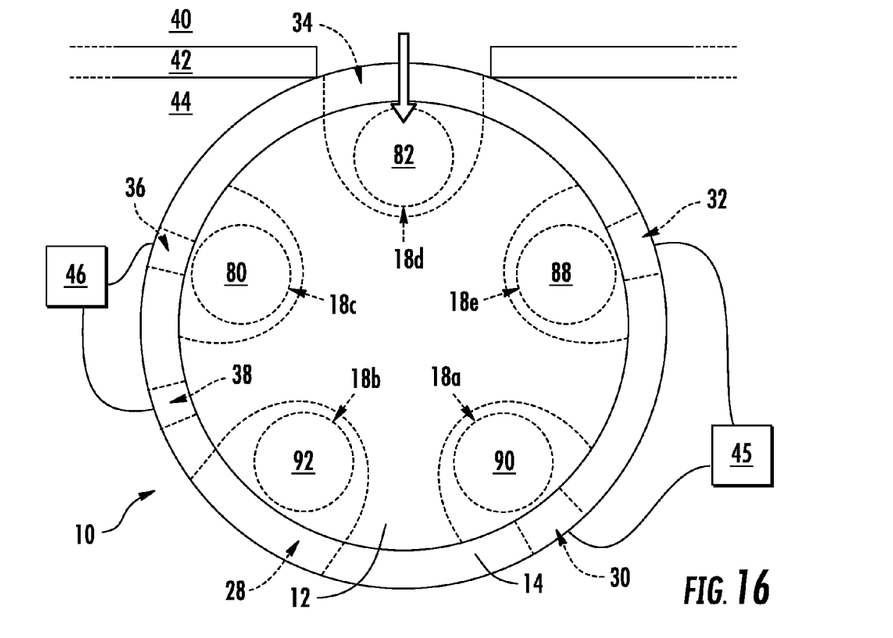

After being processed, the second workpiece 82 may, at step 210, be moved into the fourth pocket 18d via the vacuum transfer port 34 as shown in FIG. 16. Alternatively, it is contemplated that a different workpiece which may have been processed in the high vacuum environment 40 may be moved into the fourth pocket 18d.

Figure 17:
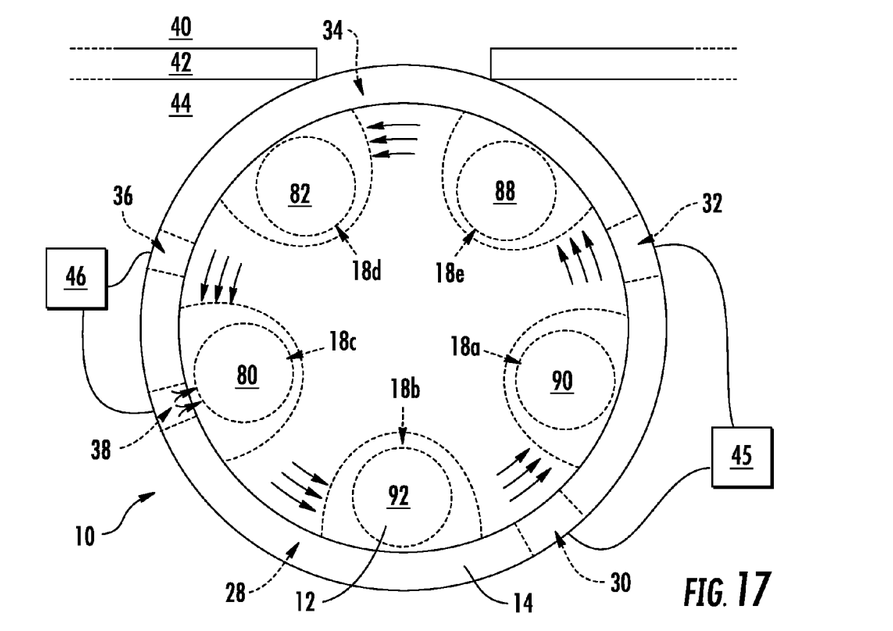

At step 220, the drive mechanism 68 may rotate the carrier disc 12 counterclockwise as shown in FIG. 17. As the carrier disc 12 is being rotated, the third pocket 18c may rotate past the second venting port 38 and may briefly become aligned therewith. As the third pocket 18c rotates past the second venting port 38, and without stopping the rotation of the carrier disc 12, the pressurized air source 46 coupled to the second venting port 38 may be activated and may "burst" an amount of air through the second venting port 38 into the third pocket 18c as shown in FIG. 17. The interior of the third pocket 18c, having been previously partially vented by the first venting port 36, may thus be completely vented to atmospheric pressure. Of course, it is contemplated that such venting may alternatively be performed with the carrier disc 12 stopped with the third pocket 18c aligned with the second venting port 38. It is further contemplated that the transfer housing 14 may be provided with only a single venting port that may vent the third pocket 18c to atmospheric pressure in a single step.

Figure 18:
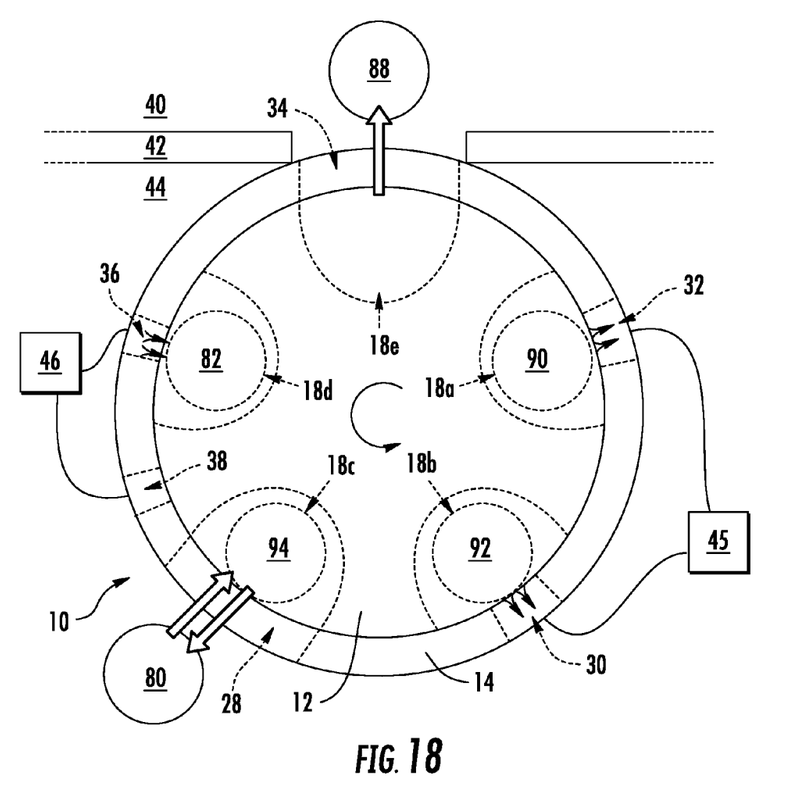

At step 230, the drive mechanism 68 may continue to rotate the carrier disc 12 counterclockwise until the third pocket 18c is brought into alignment with the atmospheric transfer port 28, the fourth pocket 18d is brought into alignment with the first venting port 36, the fifth pocket 18e is brought into alignment with the vacuum transfer port 34, the first pocket 18a is brought into alignment with the second pumping port 32, and the second pocket 18b is brought into alignment with the first pumping port 30 as shown in FIG. 18.

At step 240, the processed first workpiece 80 may be swapped with an eighth workpiece 94 as shown in FIG. 18. The first workpiece 80 may subsequently be collected for further processing in the atmospheric pressure environment 44. While the first workpiece 80 is being swapped, the fourth pocket 18d may be vented in the manner described in step 200, the fifth workpiece 88 may be moved and processed in the manner described in steps 160 and 170, the first pocket 18a may be pumped down via the second pumping port 32 in the manner described in step 140, and the second pocket 18b may be pumped down via the first pumping port 30 in the manner described in step 120.

The carrier disc 12 may operate to align the pockets 18a-e with appropriate ports in a step-wise manner, such that the carrier disc stops when the pockets are aligned in a desired manner with an associated port. Alternatively, it is contemplated that the carrier disc 12 may rotate at a constant speed.

The above-described process may be repeated with new, unprocessed workpieces being swapped into the carrier disc 12 and processed workpieces being swapped out of the carrier disc 12 in a continuous, sequential manner.

Thus, all semiconductor workpieces that are transferred into and out of the high vacuum environment 40 by the device 10 are exposed to substantially identical environmental conditions. Moreover, the air bearings 58a-c and 60a-c of the device 10 minimize the presence of contaminants that could otherwise result from engagement between the carrier disc 12 and the transfer housing 14, while the differential pumping regions 52-56 seal the high vacuum environment 40 from gas that may migrate from the air bearings 58a-c and 60a-c and the atmospheric pressure environment 44. It will therefore be appreciated that the device 10 provides enhanced consistency among semiconductor workpieces, as well as generally cleaner semiconductor workpieces, relative to other transfer systems and configurations. In addition, the manner in which workpieces are transferred into and out of the high vacuum environment 40 by the device 10, including the manner in which the pockets 18a-e are pumped and vented, results in greater workpiece throughput relative to other transfer systems and configurations.

For example, as previously noted, although the illustrated embodiment includes a pair of pumping ports (first and second pumping ports 30, 32) and a pair of venting ports (first and second venting ports 36, 38), any number of pumping ports and venting ports can be used, as desired. Thus, it will be understood that there can be multiple stages of pumping and/or multiple stages of venting, since the timely execution of a pumpdown cycle and also a venting cycle requires controlled rates and pressure ranges to optimize timing while also avoiding detrimental particle generation (e.g., condensation, agitation of particles by shock, etc.). Thus, the number of pumping and/or venting stages need not be limited.

As used herein, an element or step recited in the singular and proceeded with the word "a" or "an" should be understood as not excluding plural elements or steps, unless such exclusion is explicitly recited. Furthermore, references to "one embodiment" of the present invention are not intended to be interpreted as excluding the existence of additional embodiments that also incorporate the recited features. While certain embodiments of the disclosure have been described herein, it is not intended that the disclosure be limited thereto, as it is intended that the disclosure be as broad in scope as the art will allow and that the specification be read likewise. Therefore, the above description should not be construed as limiting, but merely as exemplifications of particular embodiments. Those skilled in the art will envision other modifications within the scope and spirit of the claims appended hereto.

The invention claimed is:

1. A device for rotationally transferring articles between an atmospheric pressure environment and a vacuum environment, the device comprising:
   a transfer housing having an atmospheric transfer port, a pumping port, a vacuum transfer port, and a venting port disposed in a circumferentially-spaced relationship, wherein the vacuum transfer port is in communication with a vacuum environment and the atmospheric transfer port is in communication with an atmospheric pressure environment;
   a carrier disc rotatably disposed within the transfer housing, the carrier disc having a pocket formed in a sidewall thereof for holding an article; and
   a differential pumping region configured to draw gas out of a gap between the transfer housing and the carrier disk, the differential pumping region comprising a groove formed in an inner sidewall of the transfer housing, the groove surrounding the vacuum transfer port;
   wherein the pumping port is configured to facilitate removal of gas from the pocket and the venting port is configured to facilitate introduction of gas into the pocket.

2. The device of claim 1, further comprising an air bearing associated with the transfer housing, the air bearing configured to maintain a gap between the transfer housing and the carrier disc.

3. The device of claim 2, wherein the air bearing comprises a plurality of air outlets through which a pressurized gas is expelled into the gap between the transfer housing and the carrier disc.

4. The device of claim 1, wherein the carrier disc is configured to be rotated relative to the transfer housing between a first position in which the pocket is aligned with the atmospheric transfer port, a second position in which the pocket is aligned with the pumping port, a third position in which the pocket is aligned with the vacuum transfer port, and a fourth position in which the pocket is aligned with the venting port.

5. The device of claim 1, wherein the differential pumping region is a first differential pumping region, the device further comprising one or more additional differential pumping regions comprising grooves or ports formed in the inner sidewall of the transfer housing.

6. The device of claim 1, further comprising a drive mechanism coupled to the carrier disc and configured to rotate the carrier disc relative to the transfer housing between several predetermined positions.

7. The device of claim 1, wherein the pumping port comprises a first pumping port and a second pumping port that are spaced apart from one another and that are configured to remove gas from the pocket in a sequential manner, and wherein the venting port comprises a first venting port and a second venting port that are spaced apart from one another and that are configured to pump gas into the pocket in a sequential manner.

* * * * *